United States Patent
Kitahira

(10) Patent No.: US 7,355,540 B2
(45) Date of Patent: Apr. 8, 2008

(54) MULTI STAGE NOISE SHAPING QUANTIZER

(75) Inventor: Naotake Kitahira, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 11/655,061

(22) Filed: Jan. 19, 2007

(65) Prior Publication Data

US 2007/0171110 A1    Jul. 26, 2007

(30) Foreign Application Priority Data

Jan. 20, 2006  (JP) ............... 2006-011978

(51) Int. Cl.
*H03M 3/00* (2006.01)
(52) U.S. Cl. ..................... 341/143; 341/143
(58) Field of Classification Search .......... 341/143
See application file for complete search history.

(56) References Cited

U.S. PATENT DOCUMENTS

| | | | | |
|---|---|---|---|---|
| 4,920,544 A | * | 4/1990 | Endo et al. ............. | 375/243 |
| 5,061,928 A | * | 10/1991 | Karema et al. ........... | 341/143 |
| 5,068,661 A | * | 11/1991 | Kaneaki et al. .......... | 341/143 |
| 5,103,229 A | * | 4/1992 | Ribner .................. | 341/143 |
| 5,124,703 A | | 6/1992 | Kaneaki et al. | |
| 5,283,578 A | * | 2/1994 | Ribner et al. ............ | 341/143 |
| 6,275,177 B1 | * | 8/2001 | Ho et al. ................ | 341/143 |

FOREIGN PATENT DOCUMENTS

| | | |
|---|---|---|
| JP | 6-83150 | 8/1988 |
| JP | 7-79257 | 2/1992 |
| JP | 8-2024 | 2/1992 |

OTHER PUBLICATIONS

Yasuyuki Matsuya et al., "A 17-bit Oversampling D-to-A Conversion Technology Using Multistage Noise Shaping", IEEE Journal of Solid State Circuit, Aug. 1989, vol. 24, No. 4, pp. 969-975.

* cited by examiner

*Primary Examiner*—Khai M. Nguyen
(74) *Attorney, Agent, or Firm*—Wenderoth, Lind & Ponack, L.L.P.

(57) ABSTRACT

The present invention is an multi stage noise shaping quantizer which includes: a first noise shaping quantizer that includes a first local quantizer which quantizes an input signal and a limiter which limits an output range of the first local quantizer, the first noise shaping quantizer performs noise shaping operation to the input signal; a second noise shaping quantizer that can input a first quantization error which occurs due to quantization operation at the first local quantizer and a limit error which occurs due to a limitation operation to the output range at the limiter as an input and performs noise shaping operation to the input; a differentiator that differentiates an output of the second noise shaping quantizer corresponding to a noise shaping order of the first noise shaping quantizer; an adder that adds an output of the differentiator to an output of the first noise shaping quantizer and output the resultant of the addition; and an amplitude controller that limits an amplitude of the limit error which occurs due to an operation of the limiter according to an output of the first local quantizer and an feedback output of the second noise shaping quantizer.

6 Claims, 11 Drawing Sheets

MULTI STAGE NOISE SHAPING QUANTIZER

BACKGROUND OF THE INVENTION

1. Field of the Invention

The present invention relates to a quantizer, and more particularly, to a noise shaping quantizer which has multi staged loops.

2. Description of the Related Art

It is well known that, in a digital signal processing, a quantizer is an important elemental technology. When the quantizer performs quantizing operation, quantization error is inevitably observed. Therefore, efforts and inventive approaches in reducing the quantization error at least in a frequency range including necessary signals have been made in recent years. As one of such approaches, a technique called noise shaping has been developed.

FIG. 1 is a block diagram of a multi stage noise shaping quantizer 101 having plural stages of loops, which is disclosed at Patent Reference 1 (Japanese patent gazette No. 8-2024-B2). The multi stage noise shaping quantizer 101 includes a main loop 103 which has two adders 111 and 113, a first local quantizer 117, a limiter 141, a subtractor 121, and a delay element 123. The main loop 103 functions as a single-integration noise shaping quantizer implementing a first order noise shaping. In addition, an adder 125, a second local quantizer 127, a subtractor 129, and a feedback circuit 131 constitute a sub-loop 105. The sub-loop 105 functions as a multi-integration noise shaping quantizer implementing a first, a second or higher order noise shaping.

A delay element 133 and a subtractor 135 constitute a differentiator 107. The differentiator 107 differentiates an output of the sub-loop 105 corresponding to the noise shaping order of the main loop 103. The output of the main loop 103 and the output of the sub-loop 105 which is differentiated by the differentiator 107 are added together and are outputted by an adder 109. Thus, the multi stage noise shaping quantizer is implemented of which noise shaping order is equal to "the noise shaping order of the sub-loop 105 plus 1." In this example, the feedback circuit 131 may include a transfer function by which the sub-loop 105 indicates its noise shaping order higher than or equal to 2. The output of the feedback circuit 131 of the sub-loop 105 is inputted to the adder 113 of the main loop 103. Thus, the output of the feedback circuit 131 is added to an input to the first local quantizer (the output of the adder 111). As mentioned above, the multi stage noise shaping quantizer 101 can suppress a magnitude of a quantization error which is to be inputted to the sub-loop 105 according to the output of the feedback circuit 131 and maintains the operation of the sub-loop 105 in a stable state. In such manner, the first local quantizer 117 performs quantizing operation to the input which is formed by the addition of the output of the feedback circuit 131 to the output of the adder 111 and outputs the resultant to the limiter 141. The limiter 141 references a condition of the differentiator 107 and limits the value of the signal to be outputted from the limiter 141 based on the condition of the differentiator 107.

At a clock when the limiter 141 does not work, the magnitude of the quantization error occurred in the main loop 103 can fall within the range of values of signals inputted to the first local quantizer 117. On the contrary, at a clock when the limiter 141 works, the magnitude of the quantization error occurred in the main loop 103 can become larger than that which might be occurred in the case where the limiter 141 did not work at that clock. Therefore, there may be the case where the value of the signal inputted to the first local quantizer 117 may grow greater at clocks after the clock when the limiter 141 works, and as a consequence, the first local quantizer 117 may overflow.

FIG. 2 shows a relationship between a value range which may be inputted to the first local quantizer 117 and an actual signal example inputted to the first local quantizer 117. With reference to this figure, the occurrence of the overflow at the first local quantizer 117 of the multi stage noise shaping quantizer 101 in FIG. 1 is described. The input range 151 being defined as a range of value which can be inputted to the first local quantizer 117 may include an input signal part 157 such as an audio signal, a quantization error part 155, a feedback output part 153 which is fed from the sub-loop 105, and a margin part 191. The margin part 191 is for the case of a limit error occurred from operation of the limiter 141. On the other hand, the example of signal 159 which may actually be inputted to the first local quantizer 117 may include the input signal part 157, the quantization error part 155, the feedback output part 153, and a limit error part 195. As illustrated, in the multi stage noise shaping quantizer 101, the magnitude of the signal 159 which is actually inputted to the first local quantizer 117 sometimes exceeds the input rage 151 of the first local quantizer 117 so that an overflowed portion 193 may occur. Needless to say, the overflowed portion 193 is also fed back after a clock. This overflowed portion 193 being fed back will blow over while one or more clocks go by.

It is to be understood that the larger the margin part 191 is set, the more decreased in frequency the occurrence of the overflow is. At the same time, the larger the margin part 191 is set, the smaller the other parts 153, 155, and 157 have to be set. This means narrowing of the range which can be assigned to the input signal part 157. Therefore, this leads to reduce the dynamic range of the first quantizer 117.

Patent Reference 1: Japanese patent gazette No. 8-2024-B2

Non-Patent Reference 1: "A 17-bit oversampling D-to-A conversion technology using multistage noise shaping", Matsuya, Yasuyuki et al., IEEE Journal of Solid State Circuit, August, 1989, Vol. 24, No. 4, p. 969-975

SUMMARY OF THE INVENTION

Further, the limiter 141 works continually or at short intervals and hence the limit error occurs continually or at short intervals when 0 dB inputs are successively inputted to the multi stage noise shaping quantizer 101. If the limit errors occur frequently, the values of the signals being inputted to the first local quantizer 117 increase at subsequent clocks and hence positive feedbacks act on the limit errors. So the quantizer 101 may overflow or oscillate potentially. Due to the potential overflow, the quantizer 101 absolutely imperatively has to use a margin part 191 of a substantial size as a practical measure to prevent from overflowing or oscillating.

The present invention, therefore, has as its object the provision of a multi stage noise shaping quantizer which can operates stably without overflowing or oscillating even when errors corresponding to the above mentioned limit error frequently occurs due to continual 0 dB inputs, for example.

Another object of this invention is to provide a multi stage noise shaping quantizer which can stably operate without overflowing or oscillating while no part corresponding to the above mentioned margin part is set or the part decreased in size at least is set.

The present invention is, in one aspect, an multi stage noise shaping quantizer which includes: a first noise shaping quantizer that includes a first local quantizer which quantizes an input signal and a limiter which limits an output range of the first local quantizer, the first noise shaping quantizer performs noise shaping operation to the input signal; a second noise shaping quantizer that can input a first quantization error which occurs due to quantization operation at the first local quantizer and a limit error which occurs due to a limitation operation to the output range at the limiter as an input and performs noise shaping operation to the input; a differentiator that differentiates an output of the second noise shaping quantizer corresponding to a noise shaping order of the first noise shaping quantizer; an adder that adds an output of the differentiator to an output of the first noise shaping quantizer and output the resultant of the addition; and an amplitude controller that limits an amplitude of the limit error which is to be inputted to the second noise shaping quantizer according to an output of the first local quantizer and an feedback output of the second noise shaping quantizer.

In one aspect of the present invention, it is preferable that the limiter limits the output range according to a condition of the differentiator.

In one aspect of the present invention, it is preferable that the differentiator includes a delay element and a subtractor which subtracts an output of the delay element from an input to the delay element and the limiter limits the output range according to the output of the delay element.

In one aspect of the present invention, it is preferable that the second noise shaping quantizer includes a second local quantizer and a feedback circuit which feeds back a second quantization error which occurs due to quantization operation at the second local quantizer using a predetermined transfer function and the multi stage noise shaping quantizer of the present invention preferably further includes another adder that adds the first quantization error, the limit error of which amplitude is limited by said amplitude controller, an output of the feedback circuit together, and a result of the addition by the another adder is inputted to the second local quantizer.

In one aspect of the present invention, it is preferable that the transfer function H(z) of said feedback circuit is $$H(z) = \frac{-2z^{-1} + 2.5z^{-2} - z^{-3}}{1 - z^{-1} + 0.5z^{-2}}.$$

In one aspect of the present invention, it is preferable that the multi stage noise shaping quantizer further includes an overflow detector that detects presence or absence of an overflow in the first local quantizer, and the amplitude controller limits the amplitude of the limit error which is to be inputted to the second noise shaping quantizer according to a result of the detection by the overflow detector.

According to the present invention, the whole multi stage noise shaping quantizer is able to keep its stable operation by limiting an amount of the error, which occurs in the first noise shaping quantizer and is fed back to an input of a main loop and also inputted to a sub-loop, by the amplitude controller.

The multi stage noise shaping quantizer of the present invention includes an output controller which has the limiter that limits the range of value of the output from the first local quantizer and the amplitude controller that monitors the condition of operation of the limiter. The present invention, by virtue of the operation of the output controller, an instantaneous increase of a limit error is controlled and inhibited and hence the multi stage noise shaping quantizer keeps its stable operation through the subsequent clocks.

The multi stage noise shaping quantizer of the present invention can operate while the margin part which is conventionally set in anticipation of increase in the limit error is not set at all or is slimmed down at least than ever. Therefore, the multi stage noise shaping quantizer of the present invention can operate stably even when the dynamic range of the input signal is widen than ever.

BRIEF DESCRIPTION OF THE DRAWINGS

These and other objects, aspects and embodiments of the present invention will more fully apparent as the following description is read in light of the attached drawings wherein.

DETAILED DESCRIPTION OF THE PREFERRED EMBODIMENTS

The multi stage noise shaping quantizer of the present invention includes: a main loop (a first noise shaping quantizer) having a first local quantizer; a sub-loop (a second noise shaping quantizer) having a second local quantizer; and a differentiator which differentiates an output of the sub-loop corresponding to a noise shaping order of the main loop. The main loop includes an output controller which limits an output of the first local quantizer and outputs the limited output. The output controller limits the output of the first local quantizer and outputs the limited output according to an output from the first local quantizer to the output controller, a feedback output from the sub-loop to the output controller, etc. By virtue of the operation of the output controller, the multi stage noise shaping quantizer of the present invention can operate more stably with a narrowed margin part than that conventionally having been set.

The above mentioned limitation may be achieved by appropriately limiting the output of the first local quantizer and outputting the limited output according to signs of the output from the first local quantizer to the output controller and the signs of feedback output from the sub-loop to the output controller.

The term of feedback output from the sub-loop to the output controller may designate a signal contained in an output for feeding back a quantization error occurred at a second local quantizer to an input of the sub-loop.

Below, preferred embodiments of the present invention are explained with reference to the drawings.

First Embodiment

Figure 3:
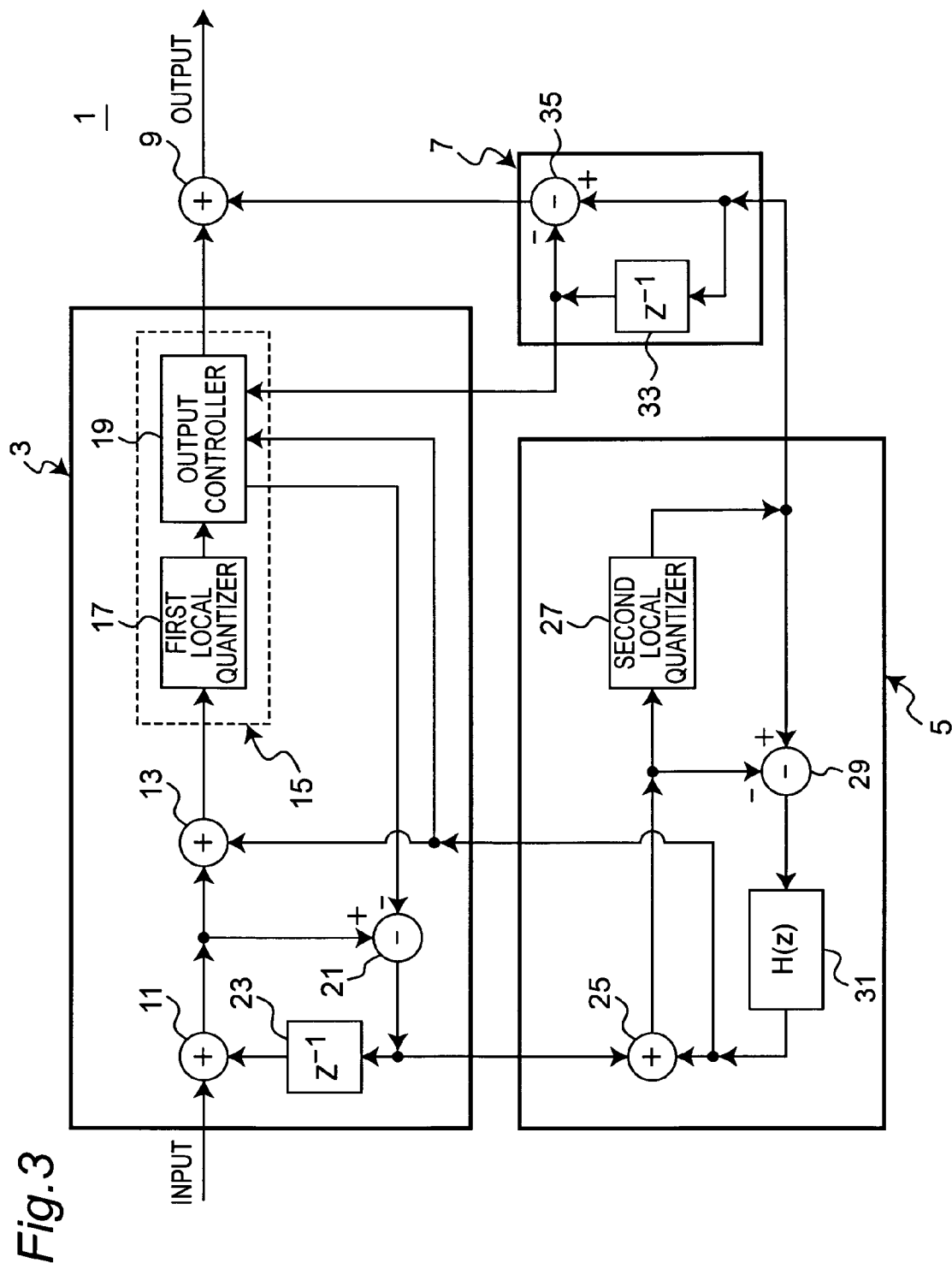
FIG. 3 is a block diagram of a multi stage noise shaping quantizer of a first embodiment according to the present invention.

FIG. 3 is a block diagram of a configuration of a multi stage noise shaping quantizer 1 according to the first embodiment of the present invention.

The multi stage noise shaping quantizer 1 includes: a main loop 3; a sub-loop 5; and a differentiator 7.

The main loop 3 has: adders 11 and 13; a first local quantizer 17; an output controller 19; a subtractor 21; and a delay element 23 and constitutes a single-integration noise shaping quantizer of a first order (a first noise shaping quantizer).

The sub-loop 5 includes: an adder 25; a second local quantizer 27; a subtractor 29; and a feedback circuit 31 and constitutes a multi-integration noise shaping quantizer of a first, second or higher order (a second noise shaping quantizer).

The differentiator 7 being constituted by a delay element 33 and a subtractor 35 differentiates an output of the sub-loop 5 according to the noise shaping order of the main loop 3 and outputs the differentiated output to an adder 9.

The adder 9 adds the output of the main loop 3 to the output of the sub-loop 3 being differentiated by the differentiator 7.

The multi stage noise shaping quantizer 1 thus configured constitutes a multi stage noise shaping quantizer of a noise shaping order of the noise shaping order of the sub-loop 5 plus 1.

In this embodiment, the feedback circuit 31 of the sub-loop 5 may use a particular transfer function H(z) such that the sub-loop 5 is designed to have a second or higher noise shaping order, for example. The transfer function H(z) may be as follows:

$$H(z) = \frac{-2z^{-1} + 2.5z^{-2} - z^{-3}}{1 - z^{-1} + 0.5z^{-2}}, \quad (1)$$

for example. In the transfer function H(z) of equation (1), the coefficients of all terms are expressed by 2, 1, or 0.5 or sum or difference between two numbers among the numbers just mentioned. The transfer function H(z) having such coefficients can be configured only by bit-shift operation, an adder, and a subtractor. It is advantageous to employ such transfer function H(z) since it enables its circuitry to be miniaturized in size. In addition, assuming that an input may be an audio signal, the transfer function H(z) shows substantially flat profile of a gain-frequency characteristic in the high frequency region lying beyond the audible frequency range and has a gain approximately equal to its maximum gain value 2.64 in that region. By employing the above mentioned transfer function H(z), noise shaping operation to a quantization error, especially to a large amount of such error can be carried out efficiently. From such viewpoint, it is also advantageous to employ such transfer function (equation (1)).

In this embodiment, the feedback output of the sub-loop 5 may be an output from the feedback circuit 31. In the main loop 3 of this embodiment, the adder 13 adds or subtracts a predetermined value to or from an input signal to the first local quantizer 17 according to the feedback output of the sub-loop 5. Thus configured, the value of the signal to be inputted to the first local quantizer 17 is modified and hence the value of a signal to be outputted to the sub-loop 5 (errors due to quantization operation by the first local quantizer 17 and output limiting operation by the output controller 19) is modified and, as a consequence, stable operation of the sub-loop 5 is ensured. When the value of the feedback output of the sub-loop 5 is large, for example, a large value is added to the input signal to the first local quantizer 17 and the first local quantizer 17 quantizes the added value. Therefore, the subtractor 21 outputs a negative large value and hence the adder 25 receives the negative large value and, as a consequence, the feedback output of the sub-loop 5 gets smaller gradually in clocks. It is to be noted that the feedback output of the sub-loop 5 may be multiplied by a multiplier (not shown) and then inputted to the adder 13.

It is also to be noted that the sub-loop 5 may include an integrator. In such configuration, the feedback output of the sub-loop 5 may be an output of this integrator.

In this embodiment, a predetermined value according to the feedback output of the sub-loop 5 is added or subtracted to or from an input signal to the first local quantizer 17. Instead, however, same effect can be obtained by shifting a quantization table of the first local quantizer 17 according to the feedback output of the sub-loop 5. Basically, same effect can also be obtained by using such approach that controls the value of a signal outputted from the main loop 3 to the sub-loop 5 appropriately according to the feedback output of the sub-loop 5.

Thus, the multi stage noise shaping quantizer 1 according to the first embodiment of the present invention is implemented, of which noise shaping order is equal to "the noise shaping order of the sub-loop 105 plus 1."

Figure 1:
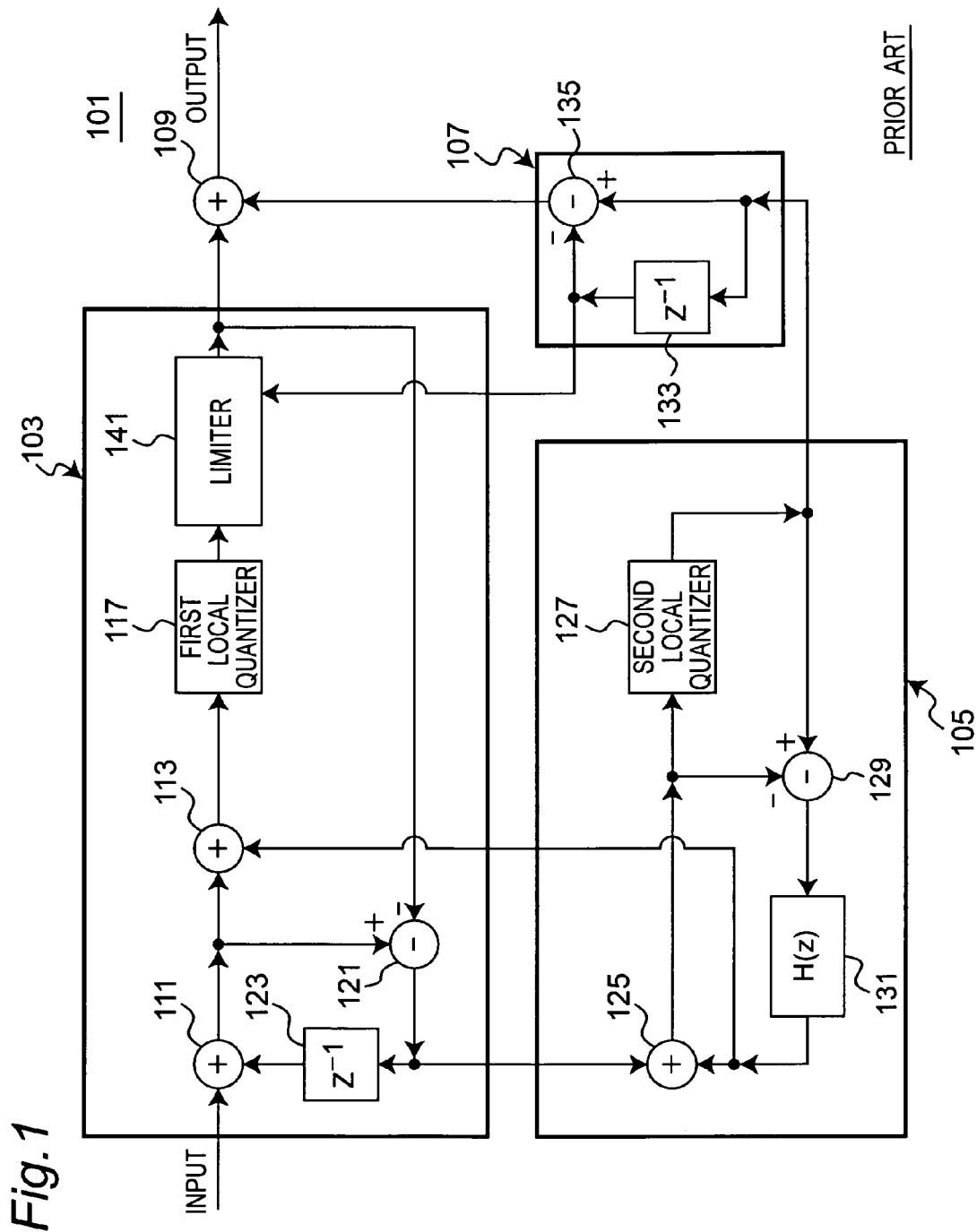
FIG. 1 is a block diagram of an illustration of a configuration of a conventional multi stage noise shaping quantizer.
Figure 4:
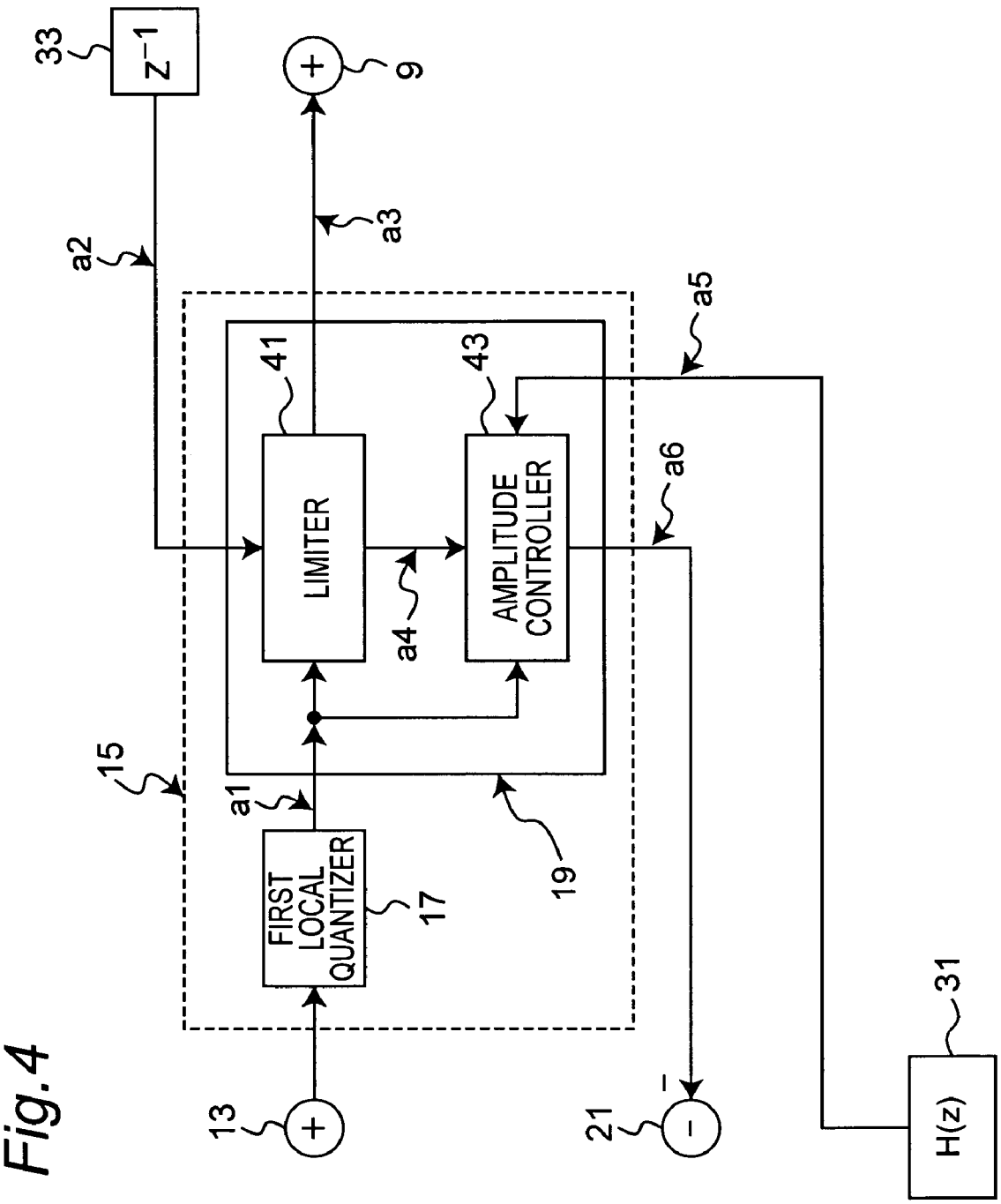
FIG. 4 is a block diagram of a configuration of an output controller of the first embodiment.

Next, the output controller 19 is described. FIG. 4 is a block diagram of the configuration of the output controller 19. The output controller 19 includes a limiter 41 and amplitude controller 43. Referring to FIG. 3, FIG. 4, and FIG. 1, it can be understood that the multi stage noise shaping quantizer 1 may be configured by appending the amplitude controller 43 to the example 101 of a conventional art of a multi stage noise shaping quantizer of FIG. 1. The limiter 41 and the amplitude controller 43 constitute the output controller 19. The output controller 19 limits an amplitude of the limit error occurred from the operation of the limiter 41 with referring to an output a1 of the first local quantizer 17 and the feedback output a5 of the sub-loop 5, and outputs the limited output (an output a6) to the subtractor 21. It is to be noted that the limiter 41 according to the present embodiment may only have to provide an equivalent functionality to the limiter 141 of the example 101 of a conventional art. It is also to be understood that the amplitude controller 43 does not operate when the limiter 41 in the output controller 19 of the multi stage noise shaping quantizer 1 does not works. In such a situation, the multi stage noise shaping quantizer 1 may operate in a similar way to that of the example 101 of the conventional art (FIG. 1).

As in the case of the limiter 141 of the example 101 of a conventional art, the limiter 41 in the output controller 19 limits the amplitude of the output signal a1 of the first local quantizer 17 according to the output signal a2 of the differentiator 7, more preferably, of the delay element 33, and output the limited output (the output a3). In fact, the limiter 41 limits the output signal a1 of the first local quantizer 17 according to the condition of the differentiator 7 (more precisely, to the output signal a2 of the delay element 33), and determines the limited output signal and outputs it a3 so that the sum of the output value to the adder 9 from the differentiator 7 (cf. FIG. 3) and the output a3 to the adder 9 from the limiter 41 may not exceed the output resolution of the multi stage noise shaping quantizer 1. Thus, the multi stage noise shaping quantizer 1 controls dynamically the output range of the output a3 from the main loop 3 according to the condition of the differentiator 7 and expands the output range of the output a3 when the output range of the output a3 can be expanded, and hence utilizes advantageously the expanded output range for the output signal from the main loop 3.

The amplitude controller 43 in the output controller 19 limits an amount of the limitation, which can be derived from the condition of the limiter 41 that is transmitted on a signal a4 from the limiter 41, according to the output signal a1 of the first local quantizer 17 and the feedback output a5 of the sub-loop 5 and determines the output signal a6 to the subtractor 21 and outputs it. The output signal a6 is subtracted from the output of the adder 11 by the subtractor 21. Then, the resultant of the subtraction at the subtractor 21 is outputted as the error occurred in the first noise shaping quantizer (main loop 3) to the delay element 23 and the adder 25 in the sub-loop 5.

Next, amplitude limitation is described, which is operated by the amplitude controller 43 and limits amplitude of the limitation error (an amount of limitation operated by the limiter 41) to be transmitted on the output a6 to the subtractor 21.

Figure 5:
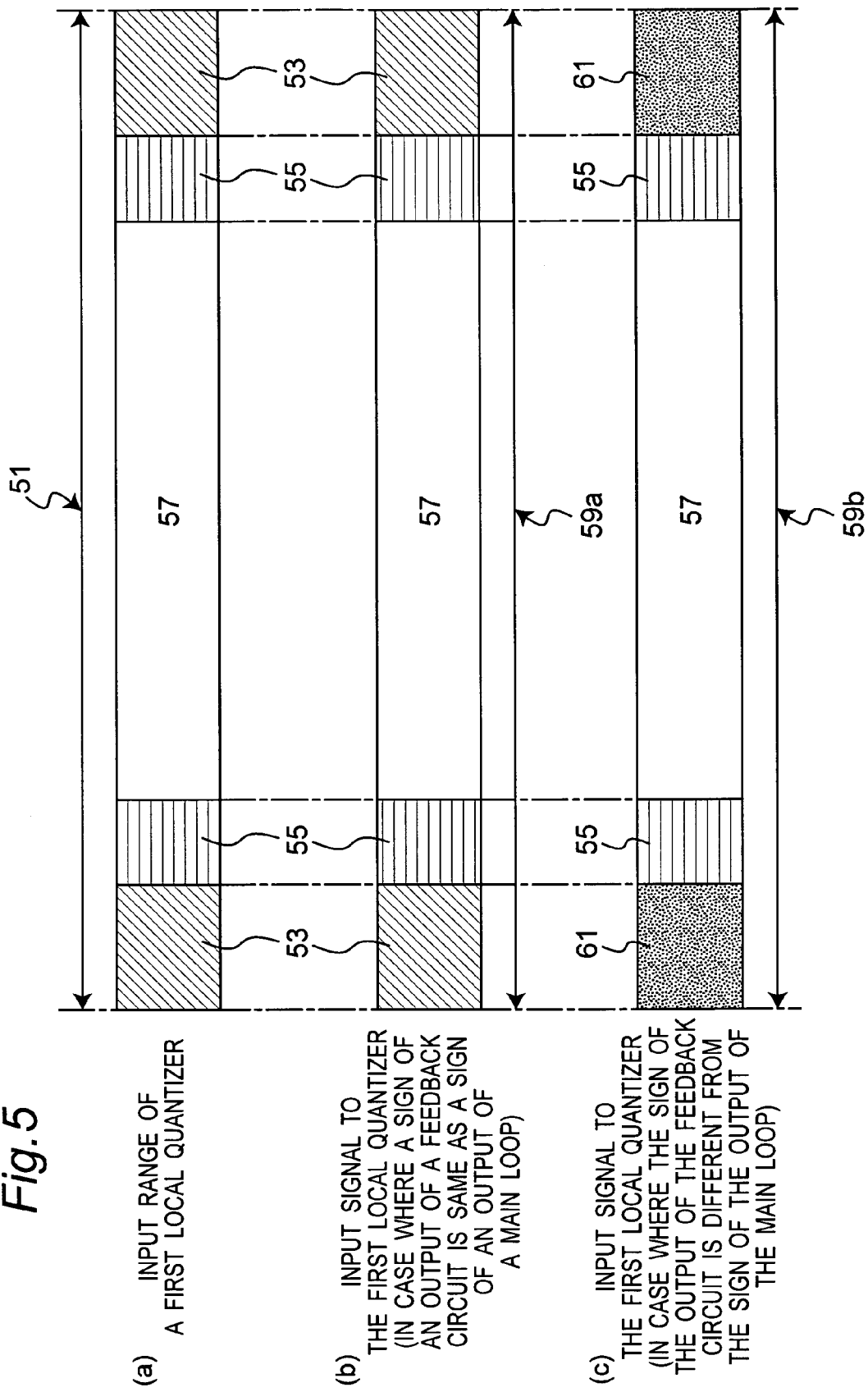
FIG. 5 is a schematic view of an input range of a first local quantizer (a), a schematic view of an input signal to the first local quantizer in case where a sign of an output of a feedback circuit is same as a sign of an output of a main loop (b), and a schematic view of an input signal to the first local quantizer in case where the sign of the output of a feedback circuit is same as the sign of the output of a main loop (c)

FIG. 5 shows an input range 51 which can be inputted without overflowing the first local quantizer 17 (a) and particulars of the input range 51 ((b) and (c)). With reference to FIG. 5, especially to its portion (a), the input range 51 may include: an input signal part 57 such as an audio signal; a quantization error part 55; and a feedback output part 53 which is fed from the sub-loop 5. Though the input range 51 may further include a margin part, no (zero) margin part is assigned in this figure. Briefly, a part corresponding to the margin part of the conventional art example illustrated in FIG. 2 for a limit error occurred from operation of the limiter 141 is not set in this embodiment. As a consequence, the range of the input signal part 57 etc. can be set much wider than that of the conventional art example. FIG. 5 also, especially in its portions (b) and (c), illustrates particulars of signals 59a and 59b which are inputted to the first local quantizer 17 when a sign of the feedback output a5 is same as that of the output a3 of the sub-loop 5 or when the sign of the feedback output a5 is different from that of the output a3 of the sub-loop 5, respectively.

As is clear from a reference to FIG. 3, a signal to be inputted to the first local quantizer 17 may include: an input signal part such as an audio signal; a feedback output part which is fed from the sub-loop 5; and a quantization error part occurring at the first local quantizer 17 and an amplitude limited limit error part representing the limit error having undergone the amplitude limitation at the amplitude controller 43, both of which are inputted through the delay element 23.

Therefore, when the input signal part 57, the quantization error part 55, and the feedback output part 53 and also the amplitude limited limit error are inputted to the first local quantizer 17, the input to the first local quantizer 17 exceeds the input range 51 of the first local quantizer 17 and, as a result, the first local quantizer 17 will overflow.

To prevent such an overflow of the first local quantizer 17, with referring to an output a1 of the first local quantizer and a feedback output a5 of the sub-loop 5, the amplitude controller 43 limits amplitude of the limit error to zero in case that the output a1 of the first local quantizer and the feedback output a5 of the sub-loop 5 indicate same signs. In summary, when the signs of both outputs a1 and a5 are the same, the amplitude controller 43 operates the amplitude limitation to the limit error and determines the output value so that the limit error should be equal to zero and outputs an output a6 to the subtractor 21. Because there is a high risk that the first local quantizer 17 will overflow due to an excessive input to the first local quantizer 17, which exceeds the input range 51, if a non-zero limit error is outputted under the above mentioned situation. It is to be noted that the amplitude controller 43 may limit the amplitude of the limit error such that the amplitude limited limit error is less than or equal to the width of a margin part and then output an output containing such amplitude limited limit error to the subtractor 21, if the margin part is set in the input range 51. In FIG. 5, especially in its portion (b), a diagram of an input 59a to the first local quantizer 17 and its contents in the case where the limit error is limited to zero by virtue of the above mentioned amplitude limitation of the amplitude controller 43 is shown. The input 59a only includes: the input signal part 57; the quantization error part 55; and the feedback output 53 since the limit error occurred in the limiter 41 is limited its amplitude to zero and outputted to the subtractor 21. Therefore, the overflow at the first local quantizer 17 never occurs.

In the meantime, with referring to the output a1 of the first local quantizer and the feedback output a5, the amplitude controller 43 limits amplitude of the limit error occurred in the limiter 41 such that the amplitude limited limit error falls within the width of the feedback output part 53 in case that the output a1 indicates a different sign from that of the feedback output a5. In FIG. 5, especially in its portion (c), a diagram of an input 59b to the first local quantizer 17 and its contents in the case where the amplitude of the limit error occurred in the limiter 41 is limited such that the amplitude limited limit error may fall within the width of the feedback output part 53 by virtue of the above mentioned amplitude limitation of the amplitude controller 43 is shown. The input 59b only includes: the input signal part 57; the quantization error part 55; and an amplitude limited limit error part 61 since the limit error occurred in the limiter is limited its amplitude so as to fall within the width of the feedback output part 53 and outputted to the subtractor 21. Therefore, the overflow at the first local quantizer never occurs. Because the feedback output a5 and the output a1 have opposite signs from each other, and, as a consequence, the resultant of an additional operation at the adder 13 (a1+a5) falls within a range of the output a1 and the feedback output part 53 illustrated in the portions (b) and (c) of FIG. 5 remains unused and the unused part is used to feed the amplitude limited limit error back. It is to be noted that the amplitude controller 43 may limit the amplitude of the limit error such that the amplitude limited limit error falls within the width of the sum of the widths of the margin part and the feedback output part 53 and then output an output containing such amplitude limited limit error, if the margin part is set in the input range 51.

An overflow in the first local quantizer 17 is prevented by the operation of the amplitude controller 43 as mentioned above.

Furthermore, the amplitude controller 43 also performs operation which serves the second local quantizer with its operation without overflow as well as the above mentioned operation.

The amplitude controller 43 obtains the range of a magnitude of an input to the sub-loop 5 (the error occurred in the main loop 3) which can be inputted to the sub-loop 5 without overflowing in the sub-loop 5 (which is referred to as the "sub-loop input range", hereinafter). The sub-loop input range may be obtained based on the value which is a quotient of division of the input range of the second local quantizer by the gain of the feedback circuit 31 of the sub-loop 5.

When the sign of the output a1 of the first local quantizer 17 and the sign of the feedback output a5 of the sub-loop 5 indicate the same sign, a polarity of the limit error occurred due to the operation of the limiter 41 coincides with a polarity of the output from the feedback circuit 31 to the adder 25 (feedback output a5). Hence the amplitude controller 43 has to limit the amplitude of the limit error and output the amplitude limited limit error such that the sum of the feedback output a5 and the input from the main loop 3 (the error occurred in the main loop 3) should not exceed the sub-loop input range.

In addition, when the sign of the output a1 of the first local quantizer 17 and the sign of the feedback output a5 are different from each other, the polarity of the limit error occurred due to the operation of the limiter 41 and the polarity of the output from the feedback circuit 31 to the adder 25 (feedback output a5) indicate opposite polarities to each other. Therefore, the amplitude controller 43 may limit the amplitude of the limit error, without consideration for the magnitude of the feedback output a5, such that the input from the main loop 3 to the sub-loop 5 (the error occurred in the main loop 3) should not exceed the sub-loop input range.

The amplitude of the limit error which does not overflow both of the first local quantizer 17 and the second local quantizer 27 can prospectively be obtained before the operation of the amplitude limitation at each clock both in the cases where the sign of the output a1 of the first local quantizer and the sign of the feedback output a5 of the sub-loop 5 have same signs or different signs. The amplitude controller 43 may determine an amplitude limitation value according to the width of the margin part set in the input range 51, feedback output a5, and the sub-loop input range in case that the sign of the output a1 is same as that of the feedback output a5, and the amplitude controller 43 may determine the amplitude limitation value according to the widths of the feedback output part 53 and the margin part set in the input range 51 and the sub-loop input range in case that in case that the sign of the output a1 is different from that of the feedback output a5. Then, the amplitude controller 43 limits the amplitude of the limit error, which occurs due to the operation of the limiter 41 and is to be outputted to the subtractor 21, to the determined amplitude limitation value according to the sign of the output a1 of the first local quantizer 17 and the sign of the feedback output a5 of the sub-loop 5.

Figure 6:
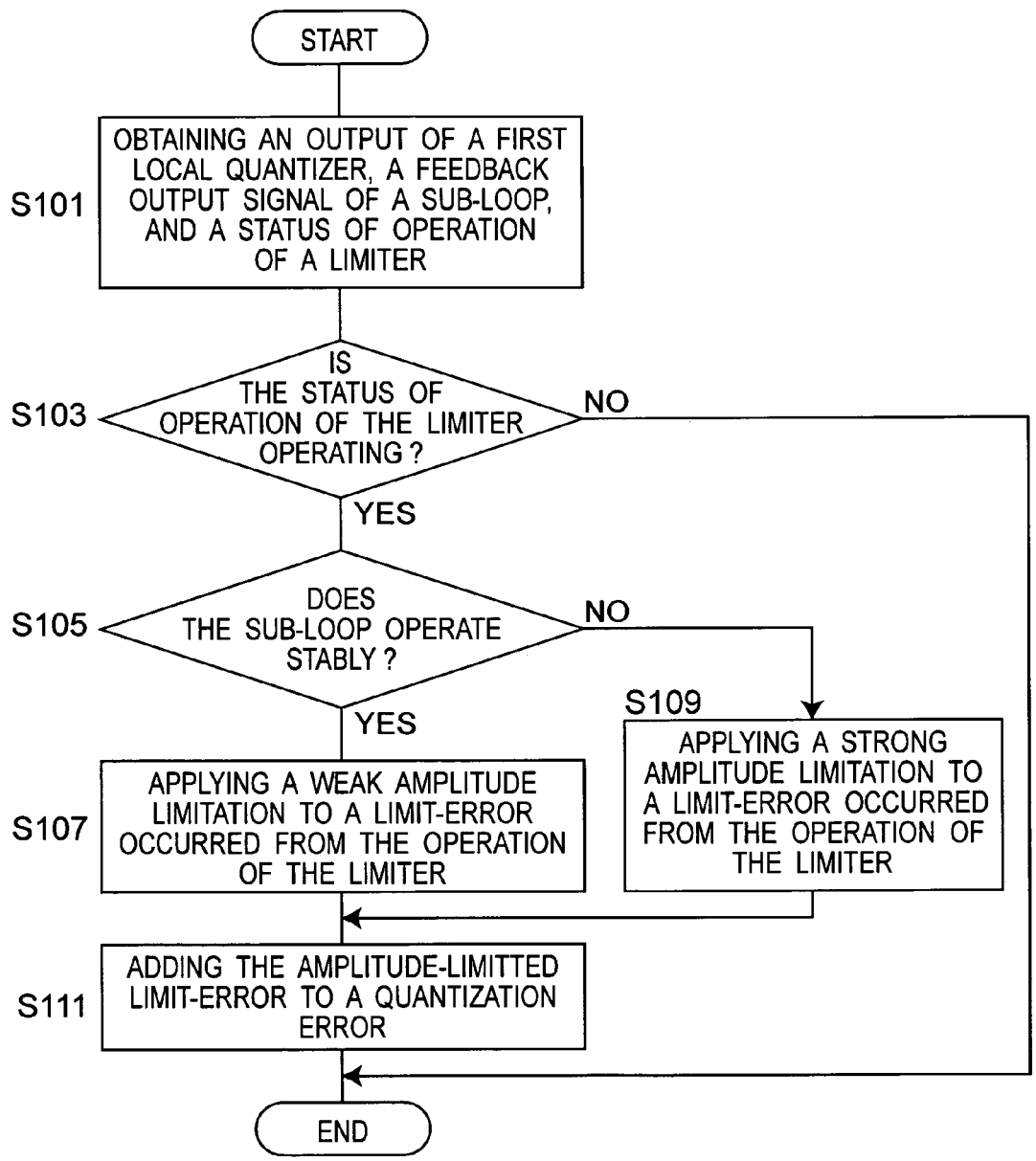
FIG. 6 is a flow chart of operation of an amplitude controller of the first embodiment.

FIG. 6 is a flow chart of the operation of the amplitude controller 43.

At step S101, the amplitude controller 43 obtains the output a1 of the first local quantizer 17, feedback output signal a5, and the condition of the operation (operational level) of the limiter 41 (a4 in FIG. 4).

At step S103, the amplitude controller 43 checks whether the limiter 41 operates or not according to the condition a4 of the limiter 41 which is obtained at step S101.

When the amplitude controller 43 determines that the limiter 41 does not operate ("NO" in step S103), the operational process of the amplitude controller 43 terminates since no limit error occurs.

When the amplitude controller 43 determines that the limiter 41 operates ("YES" in step S103), the operational process proceeds to step S105.

At step S105, the amplitude controller 43 compares the sign of the output a1 of the first local quantizer 17 to the sign of the feedback output a5 of the sub-loop 5 and determines the stability of the sub-loop 5 to the limit error (whether the two signs are the same or not).

At step S105, the process proceeds to step S109, when the sign of the output a1 is the same as that of the feedback output a5 ("NO" in step S105).

At step S109, the amplitude controller 43 determines the amplitude limitation value and operates the amplitude limitation to the limit error which is to be outputted to the subtractor 21. For example, the limit error to be outputted to the subtractor 21 must be zero when no margin part is set in the input range 51. Consequently, the amplitude controller 43 outputs the output a1 to the subtractor without any modification (output a6). Here, the specific numerical exemplification is given as follows: when the output a1 is 10, the output a3 is 8, and the amplitude limitation value is zero, the output a1, that is, 10 is directly outputted as the output a6 such that the amount of the limit error to be outputted to the subtractor 21 may become zero.

At step S105, the process proceeds to step S107, when the sign of the output a1 is different from that of the feedback output a5 ("YES" in step S105).

At step S107, the amplitude controller 43 also determines the amplitude limitation value and operates the amplitude limitation to the limit error which is to be outputted to the subtractor 21. The amplitude limitation value which is determined at step S107 is the amplitude limitation value that operates weak amplitude limitation comparing with the amplitude limitation operated in step S109. In fact, the amplitude limitation in step S107 is referred to as the "weak" amplitude limitation and the amplitude limitation in step S109 is referred to as the "strong" amplitude limitation in the flow chart of FIG. 6. In case that no margin part is set in the input range 51, for example, the amplitude of the limit error to be outputted may not exceed the smaller value between the width of the feedback output part 53 (cf. FIG. 5) and the magnitude of the input from the main loop 3 to the sub-loop 5 which may not exceed the sub-loop input range. Therefore, the amplitude controller 43 determines the amplitude limitation value to the smaller value above mentioned. Here, the specific numerical exemplification is given as follows: when the output a1 is 10, the output a3 is 8, and the amplitude limitation value is 1, the amplitude of the limit error (a1−a3=2) is limited to 1 and the value of 9 is outputted as the output a6 to the subtractor 21.

At step S111, the amplitude controller 43 outputs the output a6 to the subtractor 21.

As stated, the amplitude controller 43 determines the amplitude limitation value using the two sets of determination processes according to the comparison between the sign of the feedback output a5 and the sign of the output a1 of the first local quantizer 17 and limits the amplitude of the limit error which has occurred in the limiter 41 and is to be outputted to the subtractor 21.

In summary, the output controller 19 operates an amplitude limitation operation to the limit error to be outputted to the subtractor 21 so as to prevent the first local quantizer 17 from overflowing due to the increase of the sign-inverted quantization error and limit error, which is generated at the subtractor 21. In the same time, the amplitude controller 43 determines the amplitude limitation value to the limit error which has occurred due to the operation of the limiter 41 and is to be outputted to the subtractor 21 by comparing the sign of the output a5 of the feedback circuit 31 of the sub-loop 5 with the sign of the output a1 of the first local quantizer 17 and checking whether the signs are the same or different from each other to prospect the amount of the error which is to be transmitted through the main loop 3 and the sub-loop 5.

In fact, the output controller 19 properly limits the amplitude of the limit error which is to be contained in the input to the first local quantizer 17 so that the input to the first local quantizer 17 may not exceed the input range 51 of the first local quantizer 17. Therefore, it prevents the quantizer 1 from falling into the overflowing condition where larger quantization error than that occurred at its normal condition occurs, and, hence, prevents the error from increasing. Furthermore, the multi stage noise shaping quantizer 1 of the present invention can stabilize the main loop 3 and the sub-loop 5 without setting the margin part in the input range 51 of the first local quantizer 17.

Yet furthermore, by preventing the first local quantizer 17 from overflowing and adding the predetermined value to the input signal to the first local quantizer 17 according to the output of the feedback circuit 31 of the sub-loop 5 (operation of the adder 13), it is constantly possible to suppress the error to be inputted to the sub-loop 5 and maintain the effect of the technique for making the sub-loop 5 operate in good order and, as a consequence, to improve the stability of the main loop 3 and the sub-loop 5.

Yet also furthermore, it is not necessary to set the margin in the input range 51 of the first local quantizer 17 and then the proportion of the input signal part 57 such as an audio signal to the entire input range of the first local quantizer 17 can be increased and, hence, the output amplitude of the audio signal can be increased. According to the simulations, assuming the output amplitude in the case where the present invention is not applied be as 100%, the output amplitude of 113.006% is achieved to the input of 0 dB 1 kHz and the output amplitude of 113.227% is achieved to the input of 0 dB 10 kHz in the case where the present invention is applied. In addition, the output amplitude of 115.384% is achieved to the input signal which is in the range where the limiter 41 does not operate. It means that the increase of the output signal amplitude by virtue of the ridding of the margin part is observed.

According to the other simulations, the distortion rates of 6.4% and 5.1% are observed for the 0 dB 1 kHz input and the 0 dB 10 kHz input, respectively in the case where the present invention is not applied. On the other hand, the distortion rates of 2.2% and 1.0% are achieved for the 0 dB 1 kHz input and the 0 dB 10 kHz input, respectively. This means that the effect for improving of distortion is observed.

As stated above, it is possible to operate the two local quantizers 17 and 27 without overflowing by using the two sets of processes for determining the amplitude limitation value even if no margin part is set in the input range 51. As a consequence, it is possible to set the wider input signal part 51 etc. than ever before and, hence, the multi stage noise shaping quantizer 1 which has wider dynamic range and is more stable than ever is achieved.

Second Embodiment

Other configurations of the output controller which can be employed to the multi stage noise shaping quantizer 1 according to the first embodiment are described.

Figure 7:
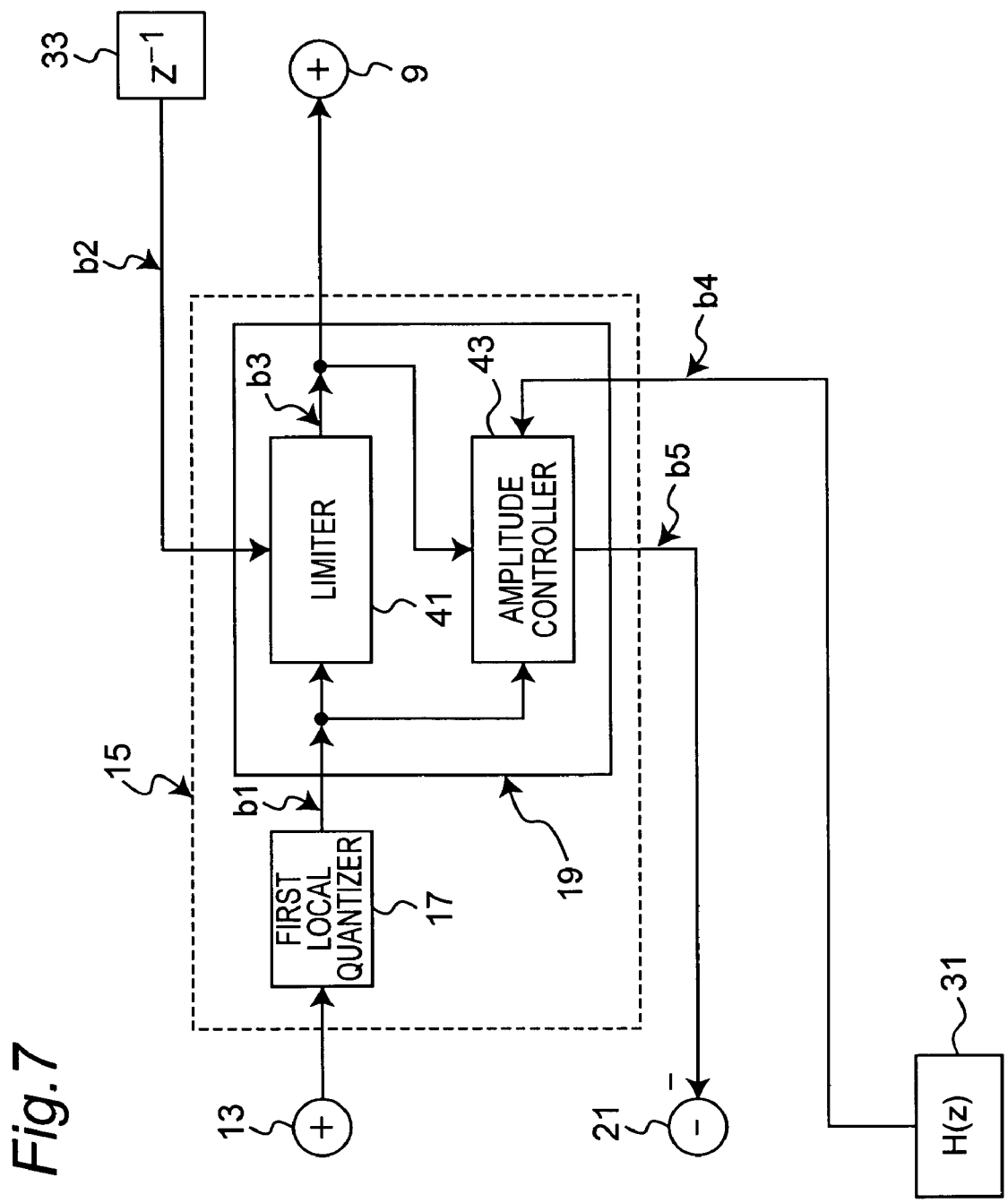
FIG. 7 is a block diagram of another configuration of the output controller according to a second embodiment.
Figure 8:
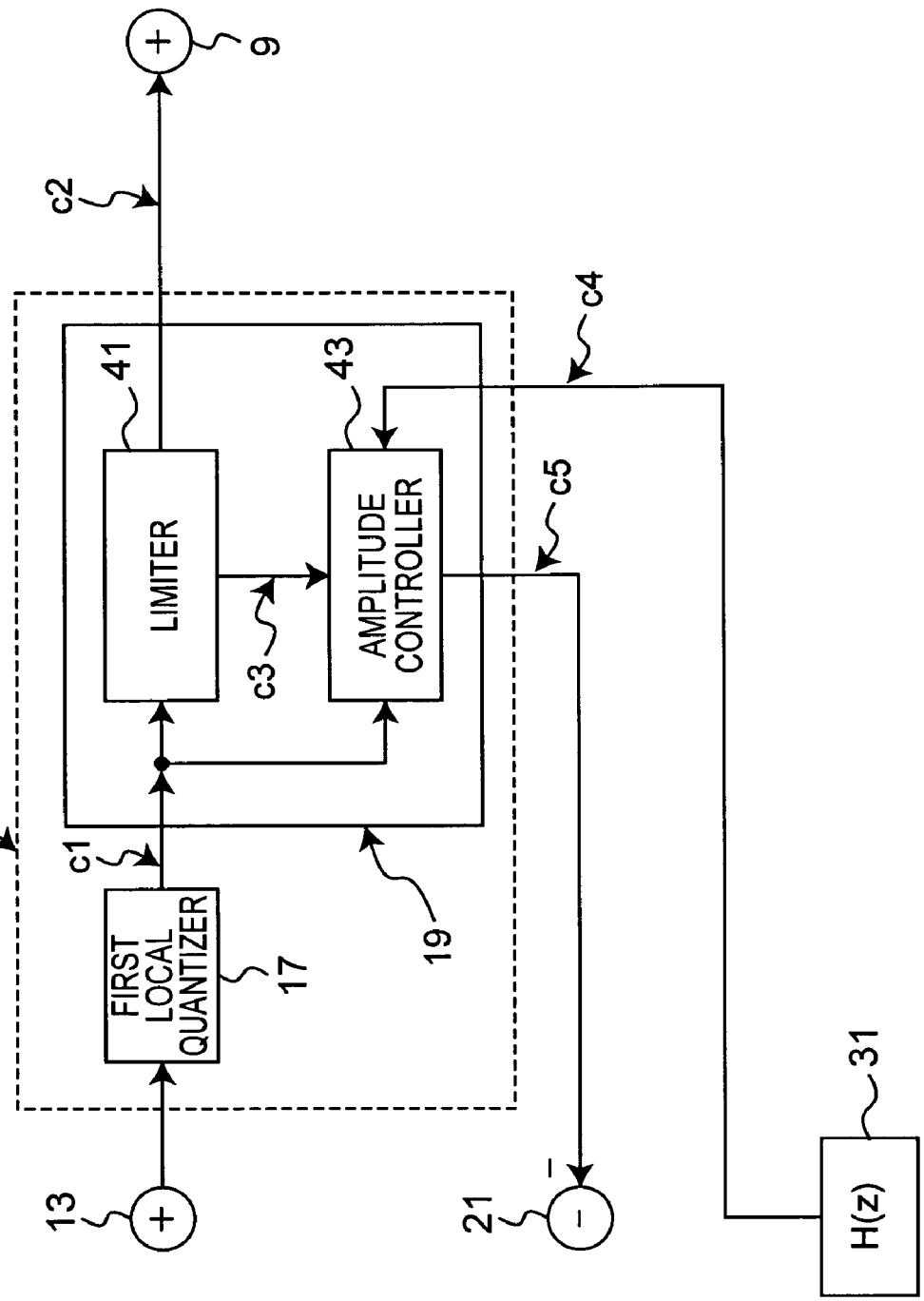
FIG. 8 is a block diagram of a further configuration of the output controller according to the second embodiment.
Figure 9:
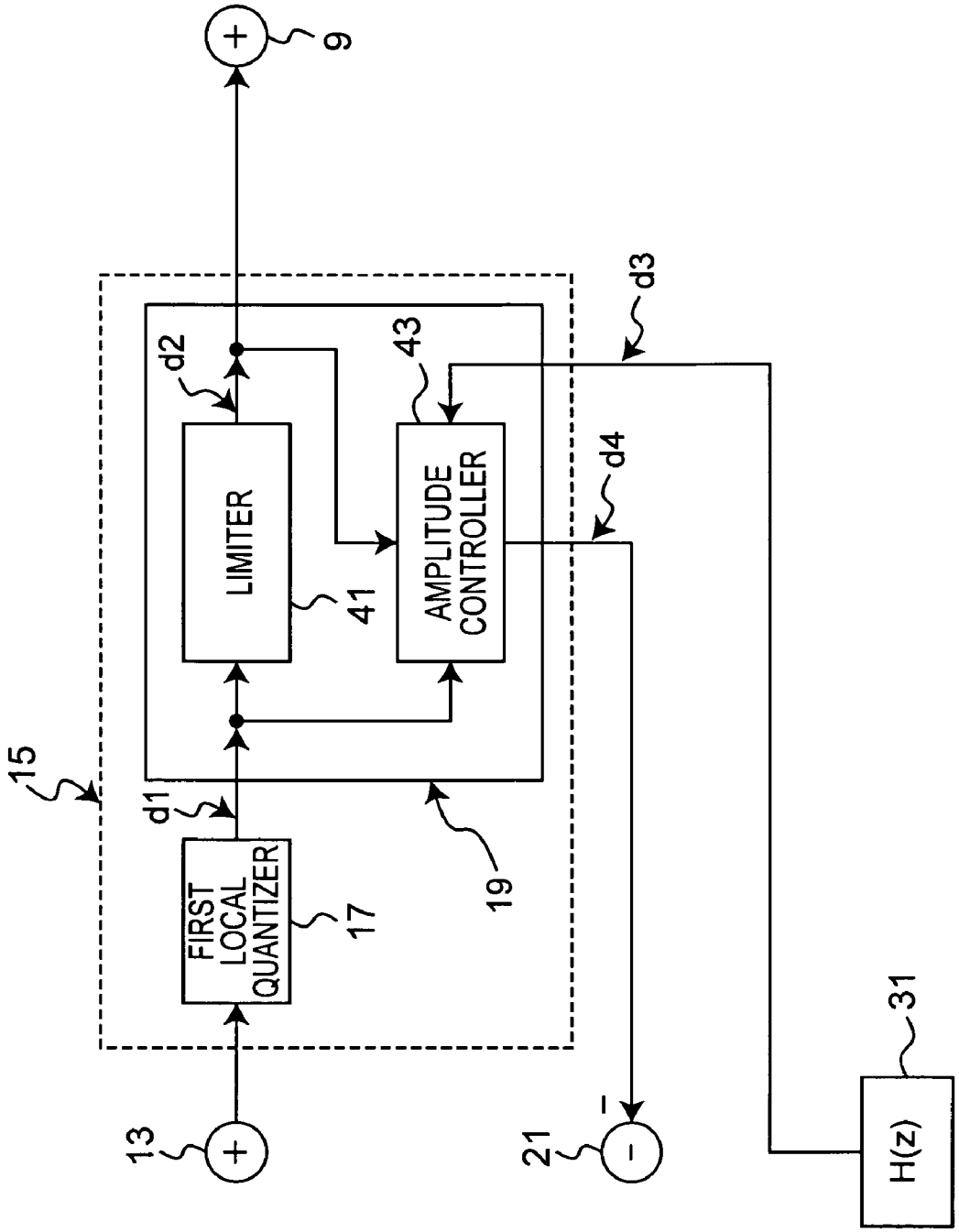
FIG. 9 is a block diagram of an even further configuration of the output controller according to the second embodiment.

FIG. 7, FIG. 8, and FIG. 9 are block diagrams of the other examples of configurations of the output controller 19.

First, the output controller 19 of FIG. 7 is described.

Figure 2:
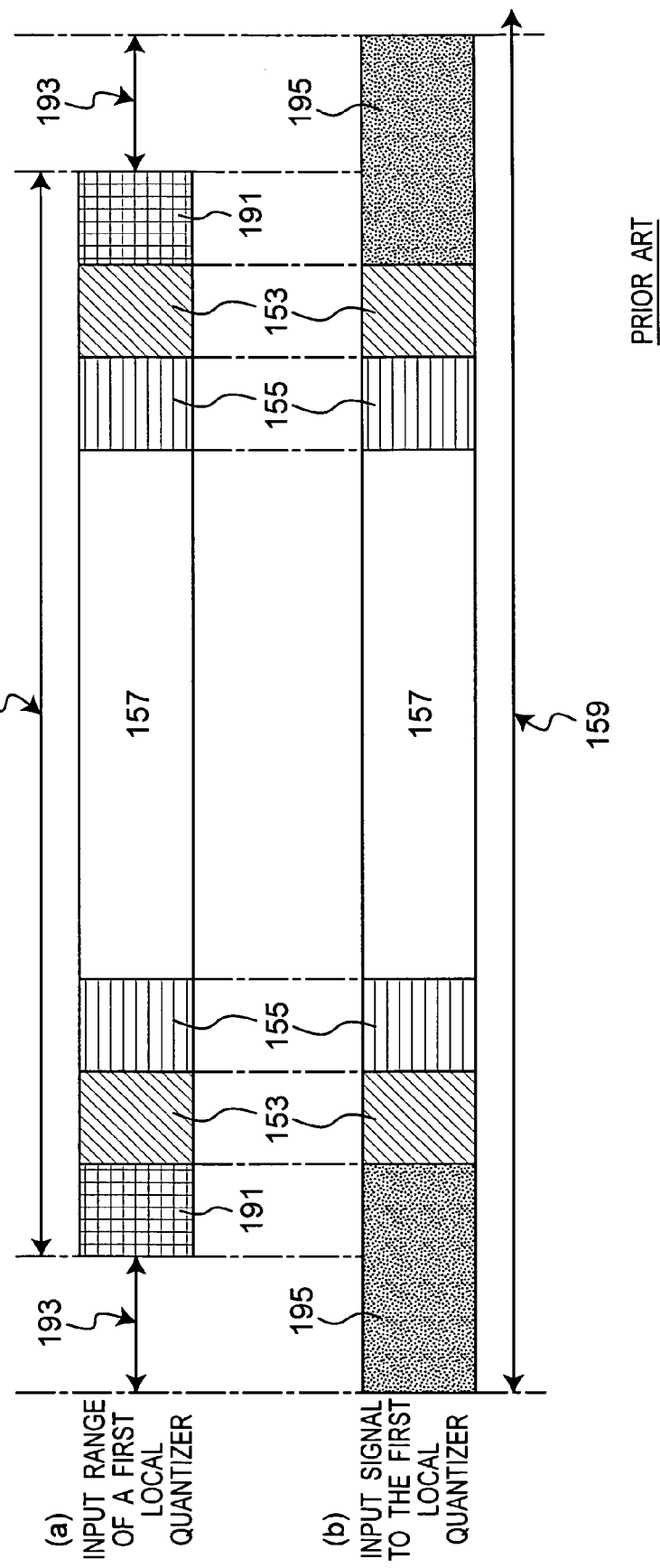
FIG. 2 is a schematic view of a conventional input range of a local quantizer (a) and a schematic view of a conventional input signal to the local quantizer (b)

In the output controller 19 shown in FIG. 7, the amplitude controller 43 utilizes an output b3 which is an output from the first local quantizer 17 and limited by the limiter 41 to obtain the operational condition of the limiter 41 instead of the output signal a4 which indicates the operational level of the limiter (cf. FIG. 2).

A specific example is given below. When the output b1 of the first local quantizer 17 is 6 and the output which is an output of the first local quantizer 17 limited by the limiter is 5, the amplitude controller 43 can recognize according to the outputs b1 and b3 that the limiter 41 operated and limited the output b1 of the first local quantizer 17 by only an amount of 1.

Just stated above, the amplitude controller 43 shown in FIG. 7 can obtain the similar information to the case shown in FIG. 4 and, hence, can operate similarly to the case shown in FIG. 4.

The limiter 41 of the output controller 19 shown in FIG. 8, differing from the example illustrated in FIG. 4, determines an amount of the limitation to an output c1 of the first local quantizer 17 without receiving the output from the differentiator 7 or its delay element 33. Also in the present example, however, the amplitude controller 43 has the same functionality as those illustrated in FIG. 4 and FIG. 7 in the point that the amplitude controller 43 limits the amount of the limit error occurred due to the operation of the limiter 41. The output controller 19 can also help improving the stability of the main loop 3 and the sub-loop 5, similarly to the examples illustrated in FIG. 4 and FIG. 7.

Finally, the output controller of FIG. 9 is described. The limiter 41 of the output controller 19 shown in FIG. 9, similarly to the example illustrated in FIG. 8, operates without receiving the output from the differentiator 7 or its delay element 33. And, also similar to the example illustrated in FIG. 7, the amplitude controller 43 recognizes the operational condition of the limiter 41 using an output d1 of the first local quantizer 17 and an output d2 which is outputted from the first local quantizer 17 and is limited and outputted by the limiter 41. The output controller 19 configured as illustrated in FIG. 9 can also help improving the stability of the main loop 3 and the sub-loop 5, similarly to the examples illustrated in FIG. 4, FIG. 7 and FIG. 8.

Third Embodiment

A multi stage noise shaping quantizer according to the third embodiment further includes an overflow detector in a block 15 which is depicted by a dashed line in the main loop 3 of the multi stage noise shaping quantizer 1 shown in FIG. 3.

In this embodiment, the overflow detector monitors whether the overflow at the first local quantizer 17 occurs or not, and then the amplitude controller 43 properly selects the strong and weak of the amplitude limitation to the limit error according to the monitoring. By doing this, an instantaneous overflow which occurs in the first local quantizer 17 can be suppressed immediately and hence the stability of the main loop 3 is improved.

Figure 10:
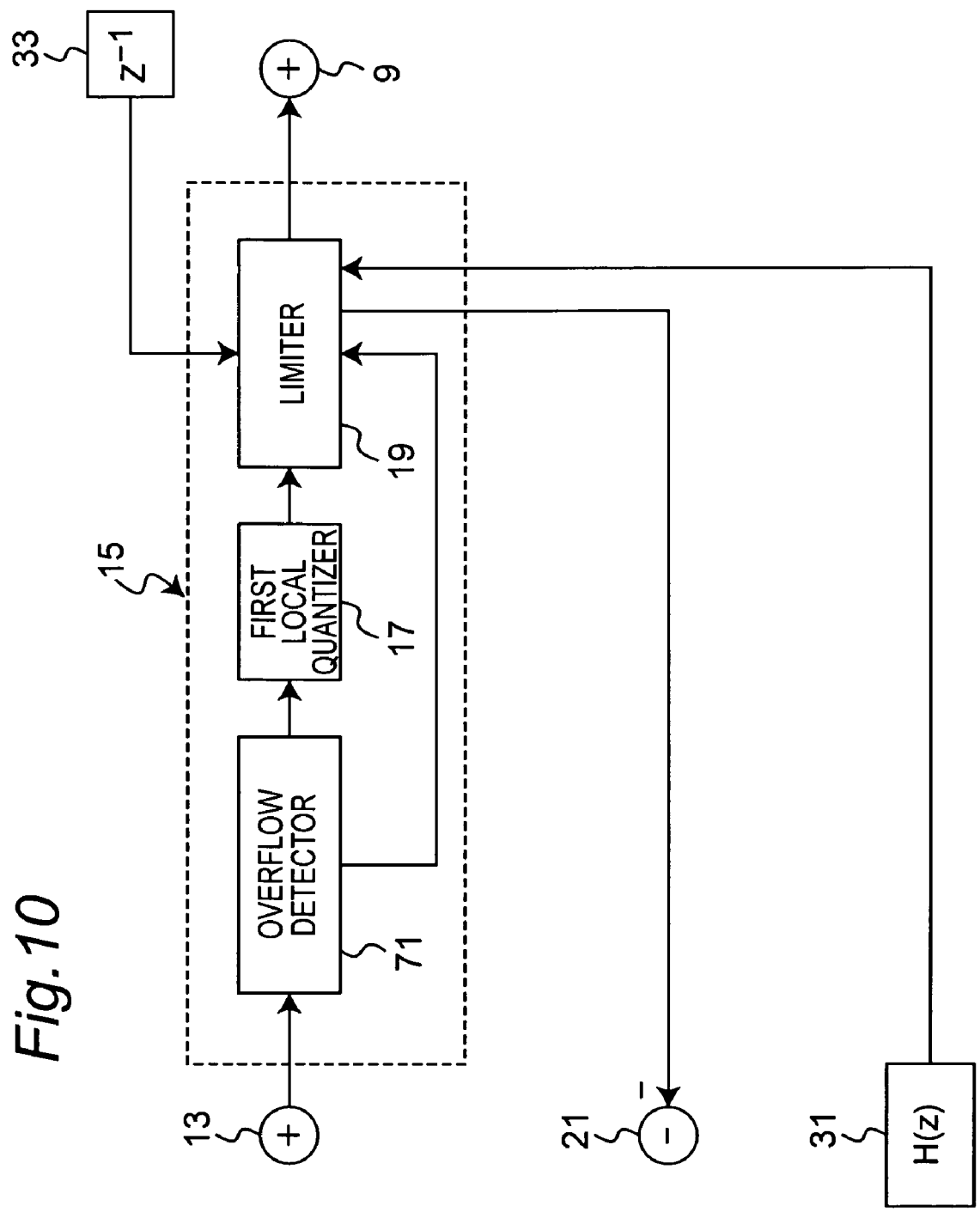
FIG. 10 is a block diagram of a configuration of a block 15 of a third embodiment.

FIG. 10 is a block diagram of the configuration of the block 15 of the multi stage noise shaping quantizer according to the present embodiment. The block 15 corresponds to the block 15 of the multi stage noise shaping quantizer 1 illustrated in FIG. 3, and other components of the present embodiment is identical to the components of the first embodiment. The overflow detector 71 monitors the presence or absence of the overflow at the first local quantizer 17 according to the output of the adder 13 and transmits an overflow condition signal of the first local quantizer 17 to the output controller 19.

Here, the meaning of a term "normal quantization error" is defined as a quantization error occurred due to the quantization operation at the first local quantizer 17 in the case where the input to the first local quantizer 17 does not exceed the input range 51 (cf. FIG. 4). Meanwhile, the meaning of a term "overflow" is defined as a condition where the input to the first local quantizer 17 exceeds the input range 51 (cf. FIG. 4) and a quantization error occurred due to the quantization operation at the first local quantizer 17 exceeds the range of the "normal quantization error." The overflow detector 71 checks whether the input to the first local quantizer 17 exceeds the input range or not and transmits the resultant of the check as the overflow detection signal to the amplitude controller 43 of the output controller 19.

Figure 11:
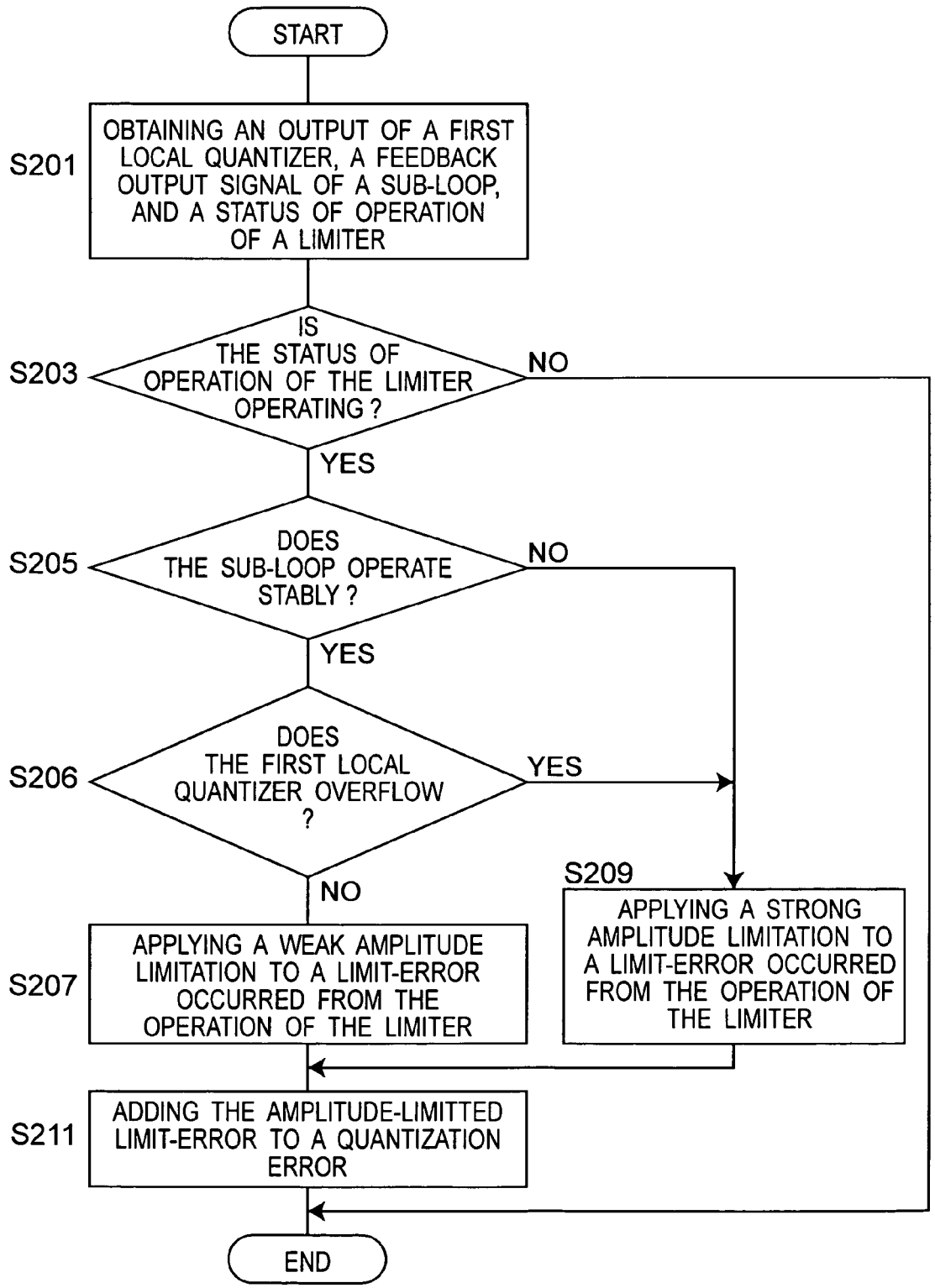
FIG. 11 is a flow chart of operation of the amplitude controller of the third embodiment.

FIG. 11 is a flow chart of the operation of the amplitude controller 43 of the multi stage noise shaping quantizer according to the present embodiment which includes the overflow detector 71. In FIG. 11, steps S201, S203, S205, S207, S209, and S211 are identical to steps S101, S103, S105, S107, S109, and S111 in FIG. 6. The flow chart shown in FIG. 11 is different from the flow chart illustrated in FIG. 6 in the point that the present chart further includes step S206.

At step S206, the amplitude controller 43 checks the presence or absence of the overflow at the first local quantizer 17 according to the overflow detection signal. In the first embodiment, the stability of the main loop 3 is determined according to the feedback output of the sub-loop 5. In the present embodiment, it is checked whether the quantization error occurred due to the quantization operation at the first local quantizer 17 is increased because of a presence of the overflow of the first local quantizer 17 or not and, hence, the stability control is further improved.

When the amplitude controller 43 determines that the overflow occurs in the first local quantizer 17 according to the overflow detection signal ("YES" in step S206), the process proceeds to step S209.

When the amplitude controller 43 determines that the overflow does not occur in the first local quantizer 17 according to the overflow detection signal ("NO" in step S206), the process proceeds to step S207.

As stated, the amplitude controller 43 of the output controller 19 controls the amount of the error which occurs due to the operation of the output controller 19 according to the overflow detection signal outputted by the overflow detector 71 and, hence, the occurrence of the overflow in the main loop 3 is averted with higher accuracy. Averting the overflow prevents the growth of the quantization error which occurs in the first local quantizer 17 and this provides further stable circuit operation of the main loop 3.

It is to be noted that the overflow detector 71 in the third embodiment is not limited to the configuration explained above. The present invention can be applied to a quantizer which includes a component such as a limiter that generates an error.

The multi stage noise shaping quantizer of the present invention achieves advancement in its operational stability and an increase of amplitude of output signal. The present invention can be applied to audiovisual instruments, for example.

The disclosure of Japanese Patent Application No. JP2006-011978 filed on Jan. 20, 2006 including the specification, drawings and abstract is incorporated herein by reference in its entirety.

What is claimed is:

1. A multi stage noise shaping quantizer, comprising:
a first noise shaping quantizer that includes a first local quantizer which quantizes an input signal and a limiter which limits an output range of said first local quantizer, said first noise shaping quantizer performs noise shaping operation to the input signal;
a second noise shaping quantizer that can input a first quantization error which occurs due to quantization operation at said first local quantizer and a limit error which occurs due to a limitation operation to the output range at said limiter as an input and performs noise shaping operation to the input;
a differentiator that differentiates an output of said second noise shaping quantizer corresponding to a noise shaping order of said first noise shaping quantizer;
an adder that adds an output of said differentiator to an output of said first noise shaping quantizer and output the resultant of the addition; and
an amplitude controller that limits an amplitude of the limit error which is to be inputted to said second noise shaping quantizer according to an output of said first local quantizer and an feedback output of said second noise shaping quantizer.

2. The multi stage noise shaping quantizer according to claim 1, wherein said limiter limits the output range according to a condition of said differentiator.

3. The multi stage noise shaping quantizer according to claim 2 wherein:
said differentiator includes a delay element and a subtractor which subtracts an output of said delay element from an input to said delay element; and
said limiter limits the output range according to the output of said delay element.

4. The multi stage noise shaping quantizer according to claim 1, wherein said second noise shaping quantizer includes a second local quantizer and a feedback circuit which feeds back a second quantization error which occurs due to quantization operation at said second local quantizer using a predetermined transfer function and, further comprising another adder that adds the first quantization error, the limit error of which amplitude is limited by said amplitude controller, an output of said feedback circuit together, and a result of the addition by said another adder is inputted to said second local quantizer.

5. The multi stage nose shaping quantizer according to claim 4, wherein the transfer function H(z) of said feedback circuit is $$H(z) = \frac{-2z^{-1} + 2.5z^{-2} - z^{-3}}{1 - z^{-1} + 0.5z^{-2}}.$$

6. The multi stage noise shaping quantizer according to claim 1, further comprising an overflow detector that detects presence or absence of an overflow in said first local quantizer, and
wherein said amplitude controller limits the amplitude of the limit error which is to be inputted to said second noise shaping quantizer according to a result of the detection by said overflow detector.

* * * * *